(12) United States Patent
Kim et al.

(10) Patent No.: US 7,830,496 B2
(45) Date of Patent: Nov. 9, 2010

(54) METHOD OF EXPOSING SUBSTRATE WITH ONE POLARIZATION MASK AND AT LEAST TWO LIGHTS AND APPARATUS FOR PERFORMING THE SAME

(75) Inventors: Hak Kim, Yongin-si (KR); Jun-Young Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 571 days.

(21) Appl. No.: 11/822,635

(22) Filed: Jul. 9, 2007

(65) Prior Publication Data
US 2008/0049208 A1    Feb. 28, 2008

(30) Foreign Application Priority Data
Jul. 13, 2006   (KR) .................... 10-2006-0065636

(51) Int. Cl.
*G03B 27/72* (2006.01)
*G03B 27/32* (2006.01)

(52) U.S. Cl. .......................... 355/71; 355/77
(58) Field of Classification Search .................. 355/53, 355/71, 77
See application file for complete search history.

(56) References Cited

U.S. PATENT DOCUMENTS

| 5,245,470 | A | * | 9/1993 | Keum | 359/485 |
| 2005/0105180 | A1 | * | 5/2005 | Mackey | 359/500 |
| 2005/0286035 | A1 | * | 12/2005 | Troost et al. | 355/67 |
| 2007/0242254 | A1 | * | 10/2007 | Nagasaka | 355/67 |

FOREIGN PATENT DOCUMENTS

| JP | 10-232497 | 9/1998 |
| KR | 20-0296805 | 11/2002 |
| KR | 1020030076213 A | 9/2003 |

* cited by examiner

*Primary Examiner*—Edward J Glick
*Assistant Examiner*—Deoram Persaud
(74) *Attorney, Agent, or Firm*—Harness, Dickey & Pierce, P.L.C.

(57) ABSTRACT

In a method of exposing a substrate to light and an apparatus for performing the method, a first optical unit configured to generate at least two lights and including a photomask, the at least two lights having pattern information of the photomask, and a second optical unit configured to direct the at least two lights along different paths and onto a substrate.

16 Claims, 4 Drawing Sheets

METHOD OF EXPOSING SUBSTRATE WITH ONE POLARIZATION MASK AND AT LEAST TWO LIGHTS AND APPARATUS FOR PERFORMING THE SAME

CLAIM OF PRIORITY

A claim of priority is made under 35 USC §119 to Korean Patent Application No. 10-2006-0065636 filed on Jul. 13, 2006, the contents of which are herein incorporated in their entirety by reference.

BACKGROUND

1. Field

Example embodiments of the present invention may relate to a method of exposing a substrate and an apparatus for performing the method.

2. Description of the Related Art

Generally, to manufacture a semiconductor device a photolithography process is performed to form a photoresist pattern on a semiconductor substrate. The photolithography process includes a coating process, a baking process, an exposing process, a developing process, etc. For example, a photoresist film is formed on the substrate by a coating process. The photoresist film is then hardened by a baking process. Thereafter, exposing and developing processes are performed on the hardened photoresist to transfer a photoresist pattern onto the photoresist film. A photo mask may be used in the exposing process.

The photoresist film formed on the substrate is selectively exposed to light in an exposing process. When light generated by a light source is provided to the photoresist film through the photo mask, an image of patterns formed on the photo mask may be projected onto the photoresist film. However, to achieve high degree of integration of the semiconductor device, an image of a complex pattern is projected onto the photoresist film by using two photo masks and two consecutive exposing processes. For example, a first photo mask is loaded and the photoresist film is exposed to light by using the first photo mask. The first photo mask is then unloaded, and a second photo mask is loaded. Furthermore, the photoresist film is exposed to light by using the second photo mask, and then the second photo mask is unloaded.

In the conventional method, an efficiency of the exposing process may be deteriorated because the two masks are used in two consecutive exposing processes to project an image of one pattern onto the substrate. In addition, the two masks require precise alignment. Precisely aligning images of the first and second photo masks onto the substrate is not an easy task.

SUMMARY

In an example embodiment of the present invention, an exposing method, may include providing light though a photomask, generating the light into at least two lights, the at least two lights having different pattern information of the photomask, and directing the at least two lights along different paths and onto a substrate.

In another example embodiment of the present invention, an exposing apparatus may include a first optical unit configured to generate at least two lights and including a photomask, the at least two lights having pattern information of the photomask, and a second optical unit configured to direct the at least two lights along different paths and onto a substrate.

BRIEF DESCRIPTION OF THE DRAWINGS

The above and other aspects of example embodiments of the present invention may become readily apparent by reference to the following detailed description when considered in conjunction with the accompanying drawings wherein.

DESCRIPTION OF EXAMPLE EMBODIMENTS

Figure 1:
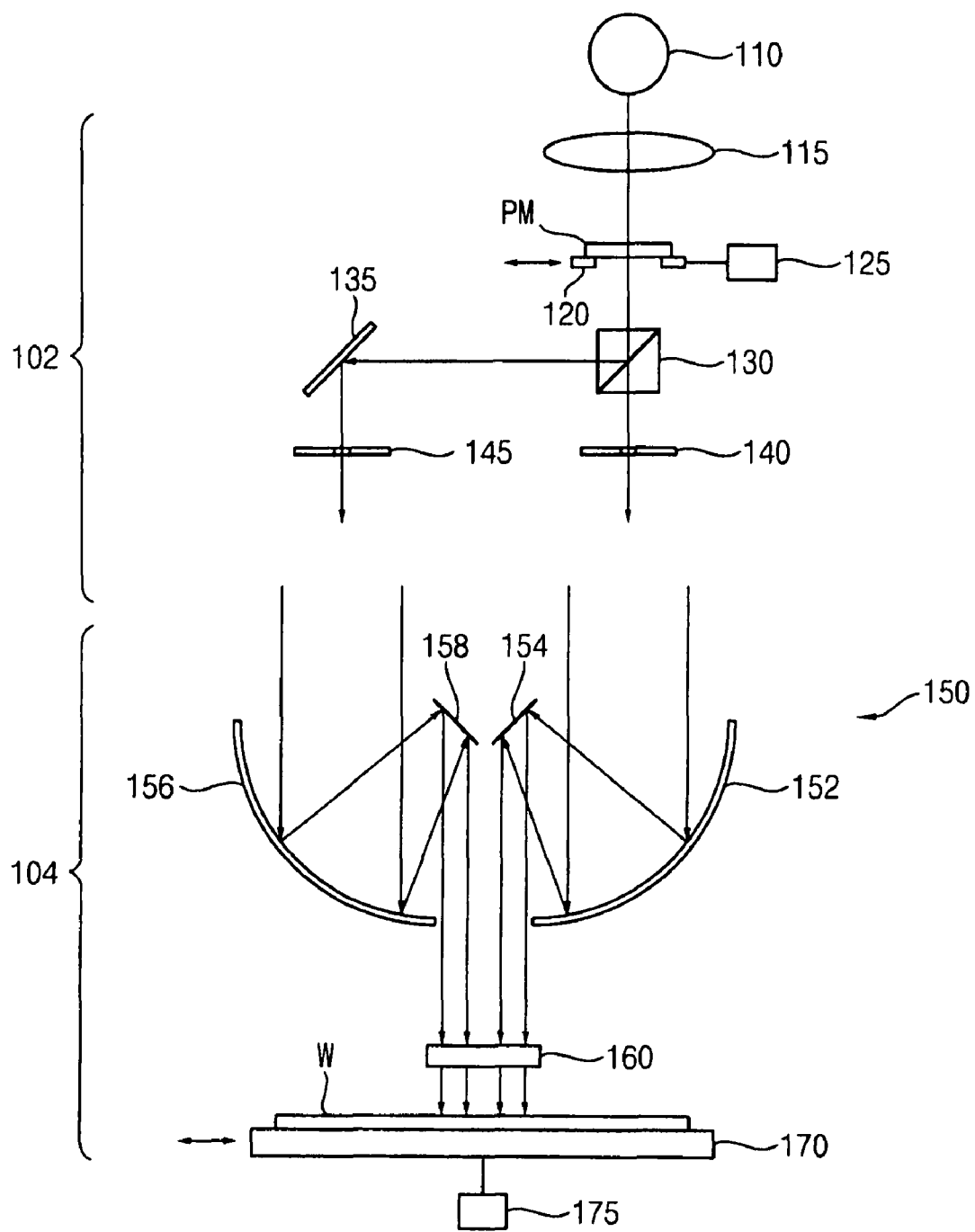
FIG. 1 is a schematic view illustrating an apparatus for exposing a substrate to light in accordance with an example embodiment of the present invention.

Example embodiments of the present invention may be described more fully hereinafter with reference to the accompanying drawings, in which example embodiments of the present invention are shown. Example embodiments of the present invention may, however, be embodied in many different forms and should not be construed as limited to the example embodiments set forth herein. Rather, these example embodiments are provided so that this disclosure will be thorough, and will fully convey the scope of example embodiments to those skilled in the art. In the drawings, the sizes and relative sizes of films and regions may be exaggerated for clarity.

It will be understood that when an element or film is referred to as being "on" or "connected to" another element or film, it can be directly on, connected or coupled to the other element or film or intervening elements or films may be present. In contrast, when an element is referred to as being "directly on" or "directly connected to" another element or film, there are no intervening elements or films present. Like numbers refer to like elements throughout. As used herein, the term "and/or" includes any and all combinations of one or more of the associated listed items.

It will be understood that, although the terms first, second, third etc. may be used herein to describe various regions, films and/or portions, these regions, films and/or portions should not be limited by these terms. These terms are only used to distinguish one regions, films and/or portions from another regions, films and/or portions. Thus, a first regions, films and/or portions discussed below could be termed a second regions, films and/or portions without departing from the teachings of the present invention.

Spatially relative terms, such as "under," "over," "lower," "above," "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic view illustrating an apparatus for exposing a substrate to light in accordance with an example embodiment of the present invention.

Referring to FIG. 1, the apparatus 100 for exposing the substrate to light may include a first optical unit 102 and a second optical unit 104.

The first optical unit 102 may generate two projection lights, each of the lights exposing different patterns of a photomask onto a substrate. In example embodiments, the photomask may be a polarization mask (PM). The first optical unit 102 may include a light source 110, a lens 115, a mask stage 120, a first driving part 125, a beam splitter 130, a polarization mask (PM), a refraction mirror 135, a first shutter 140, and a second shutter 145.

The PM may include a mask capable of achieving a polarization phenomenon. The PM selectively transmits light of a transverse electromagnetic mode. For example, the PM may selectively transmit transverse magnetic mode light or transverse electric mode light. For example, the PM may transmit the transverse magnetic mode light pattern and transmit the transverse electric mode light pattern to form the PM pattern on the substrate.

The light source 110 may generate light to be incident on the PM. For example, the light source 110 may be an argon fluoride (ArF) excimer laser, a fluoride (F2) laser, a krypton fluoride (KrF) excimer laser, an yttrium aluminum garnet (YAG) laser, a mercury lamp, etc. For example, the light may be a deep ultraviolet light having a wavelength of about 300 nm to about 100 nm or an extreme ultraviolet light having a wavelength of less than about 100 nm.

The light may be uniformly provided to a first surface of the PM by the lens 115. For example, the lens 115 may include a condensing lens, a fly-eye lens, or an illuminating lens (not shown). The condensing lens may condense the light generated from the light source 110. For example, the light may be uniformly provided to the first surface of the PM by the fly-eye lens. The illuminating lens may also guide the incident light to the PM.

The mask stage 120 may support the PM. The first driving part 125 may move the mask stage 120 such that the PM may move along a first direction. The first direction may be in parallel with a horizontal direction. For example, the PM driven by the first driving part 125 may move at a desired speed such that the incident light generated from the light source 110 may be provided to the PM in a scanning manner. As an alternative, the PM may discontinuously move such that the incident light may be provided to the PM in a step manner. As another alternative, the PM may be provided with the incident light in the scanning manner together with the step manner.

The beam splitter 130 may be disposed on a proceeding path of the incident light transmitted through the PM. The beam splitter 130 may reflect or transmit the light according to a polarization mode. In the transverse magnetic mode, the beam splitter 130 may transmit the transverse magnetic mode light and reflect the transverse electric mode light. In the transverse electric mode, the beam splitter 130 may reflect the transverse magnetic mode light and transmit the transverse electric mode light. Therefore, the beam splitter 130 may change the proceeding paths of the transverse magnetic mode light and the transverse electric mode light. Hereinafter, the transverse magnetic mode light or the transverse electric mode light transmitted through the beam splitter 130 may be referred to as a first projection light. In addition, the transverse magnetic mode light or the transverse electric mode light reflected by the beam splitter 130 may be referred to as a second projection light.

The refraction mirror 135 may be disposed on a second proceeding path of the second projection light. The refraction mirror 135 may refract the second projection light such that the second proceeding path of the second projection light may become parallel with a first proceeding path of the first projection light.

The first shutter 140 may be disposed on the first proceeding path of the first projection light. When the first shutter 140 is opened, the first projection light may proceed through the first shutter 140. When the first shutter 140 is closed, the first projection light may be blocked by the first shutter 140. For example, when the first projection light is provided toward an exposed portion of a substrate W, the first shutter 140 may transmit the first projection light. However, when the first projection light is provided only toward a portion of the substrate W excluding the exposed portion thereof, the first shutter 140 may block the first projection light.

The second shutter 145 may be substantially the same as the first shutter 140. Thus, any further repetitive explanation will be omitted. The second shutter 145 may be disposed on the second proceeding path of the second projection light so that the second shutter 145 may transmit or block the second projection light accordingly.

The first shutter 140 and the second shutter 145 may be opened and/or closed simultaneously or consecutively. Although not illustrated in the drawings, the first shutter 140 and the second shutter 145 may control a size of a region through which the first and second projection lights may be transmitted. For example, the first shutter 140 may control a width and a length of the region through which the first projection light may be transmitted. The second shutter 145 may also control a width and a length of the region through which the second projection light may be transmitted.

The second optical unit 104 may provide the substrate W with the first and second projection lights generated from the first optical unit 102. The first and second projection lights may be provided along respective first and second proceeding paths to the substrate W. The second optical unit 104 may include a mirror 150, a projection slit part 160, a substrate stage 170, and a second driving part 175.

A photoresist film (not shown) may be formed on the substrate W. A plurality of exposure regions may be provided on the substrate W. Each of the exposed portions may include at least one die region. A size of the die region may be changed according to a type of semiconductor device. Also, a size of each of the exposed portions, and a number of the exposed portions may be determined according to the size of the die region.

The mirror unit 150 may condense the first and second projection lights, and then project the condensed first projection light and the condensed second projection light. The mirror unit 150 may include a first condensing mirror 152, a first reflecting mirror 154, a second condensing mirror 156, and a second reflecting mirror 158.

The first condensing mirror 152 and the first reflecting mirror 154 may be disposed on the first proceeding path of the first projection light. The first condensing mirror 152 may reduce a cross-sectional size of the first projection light. The first condensing mirror 152 and the first reflecting mirror 154 may have a curved (e.g., concave) shape and a flat shape, respectively. For example, the first condensing mirror 152 may be disposed on the first proceeding path of the first projection light transmitted through the first shutter 140. The first condensing mirror 152 may reflect the first projection light such that the first projection light may be concentrated at a desired point. For example, the first condensing mirror 152 may condense the first projection light. The first reflecting mirror 154 may be disposed on a proceeding path of the condensed first projection light. The first reflecting mirror 154 may change the proceeding path of the condensed first projection light so that the condensed first projection light may be irradiated at the projection slit part 160.

A condensation ratio of the first projection light may be controlled by adjusting a radius of curvature of the first condensing mirror 152. In addition, the condensation ratio of the first projection light may be controlled by adjusting a distance between the first condensing mirror 152 and the first reflecting mirror 154. In addition, optical members (not shown) to improve optical characteristics of the first projection light may be further disposed between the first condensing mirror 152 and the first reflecting mirror 154.

As illustrated in FIG. 1, the first projection light may be condensed by the first condensing mirror 152 and the first reflecting mirror 154. Alternatively, the first projection light may be condensed by a plurality of condensing mirrors and a plurality of reflecting mirrors (not shown).

The second condensing mirror 156 and the second reflecting mirror 158 may be substantially the same as the first condensing mirror 152 and the first reflecting mirror 154, respectively, except that the second condensing mirror 156 and the second reflecting mirror 158 may be disposed on the second proceeding path of the second projection light to reduce a cross-sectional size of the second projection light.

As illustrated in FIG. 1, the apparatus 100 for exposing the substrate to light may condense the first and second projection lights with the first and second condensing mirrors 152 and 154, and the first and second reflecting mirrors 156 and 158. Alternatively, the apparatus 100 for exposing the substrate to the light may concentrate the first and second projection lights by using an optical member, for example, a condenser lens.

The mirror unit 150 may condense the first and second projection lights without crossing and/or overlapping between the first and second projection lights. For example, the first and second projection lights may not be affected by each other while the first and second projection lights may be condensed. The first and second projection lights condensed by the mirror unit 150 may be irradiated to the projection slit part 160 along different proceeding paths.

The projection slit part 160 may be disposed between the mirror unit 150 and the substrate W. The projection slit part 160 may allow the first projection light and the second projection light irradiated to the substrate W through the projection slit part 160 to have similar cross-sectional sizes.

Figure 2:
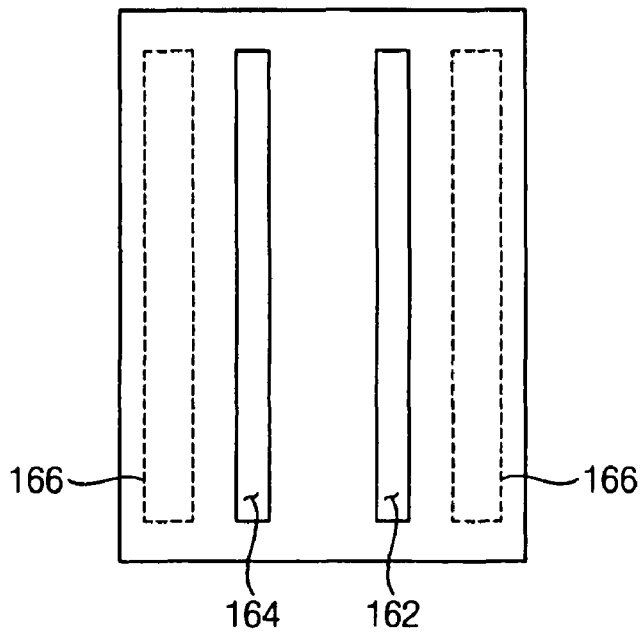
FIG. 2 is a plan view illustrating a projection slit part in FIG. 1 in accordance with an example embodiment of the present invention.

FIG. 2 is a plan view illustrating a projection slit part in FIG. 1 in accordance with an example embodiment of the present invention.

Referring to FIG. 2, the projection slit part 160 may include first and second slits 162 and 164, each having a stripe shape. The first slit 162 and the second slit 164 may have substantially the same shape and substantially the same size. For example, the first slit 162 and the second slit 164 may extend in parallel with each other.

The first projection light may proceed through the first slit 162 to be projected on the substrate W. The second projection light may proceed through the second slit 164 to be projected on the substrate W. The first projection light and the second projection light may have different pattern information. The first and second projection lights may be projected on the substrate W along different proceeding paths. Therefore, the first and second projection lights, which projects different pattern information, may be projected on the photoresist film formed on the substrate W.

The first slit 162 and the second slit 164 may be spaced apart from each other so that the first and second projection lights projected on the substrate W may be apart from each other by a desired distance between the first and second slits 162 and 164. Thus, the first and second slits 162 and 164 may be disposed over the exposed portion of the substrate W. As an alternative, the first slit 162 or the second slit 164 may be disposed over the exposed portion of the substrate W. As another alternative, the first slit 162 and the second slit 164 may be disposed over the adjacent exposed portions, respectively. When the first slit 162 and/or the second slit 164 are disposed over the exposed portion of the substrate W, the first shutter 140 and/or the second shutter 145 may be opened so that the first projection light and/or the second projection light may be projected on the exposed portion of the substrate W.

The distance between the first and second slits 162 and 164 may be substantially the same as a pitch distance between the exposed portions over which the first and second slits 162 and 164 are respectively disposed. In this case, a position of the first slit 162 with respect to an exposed portion over which the first slit 162 is disposed may be substantially the same as a position of the second slit 154 with respect to another exposed portion over which the second slit 164 is disposed.

A sensor 166 may be disposed at a side of the projection slit part 160, for example, bottom side. The sensor 166 may send a signal toward the substrate W. For example, the sensor 166 may detect a signal reflected from the substrate W to calculate a distance between the projection slit part 160 and the substrate W. The signal may be light, supersonic wave, electromagnetic wave, etc. The distance between the projection slit part 160 and the substrate W measured by the sensor 166 may be used to adjust a distance between the projection slit part 160 and the substrate W and an inclination of the projection slit part 160 with respect to the substrate W.

When patterns are formed on the substrate W, a surface of the substrate W may not be even. When a layer or a film is formed on the substrate W, the upper surface of the substrate W may also not be even. Accordingly, the distance between the projection slit part 160 and the substrate W may not be uniform. When the distance between the projection slit part 160 and the substrate W is not uniform, a density of focus (DOF) of light provided to the substrate W may not be uniform. Thus, the distance between the projection slit part 160 and the substrate W may require adjustment.

With reference to FIG. 1, the substrate stage 170 may support the substrate W. The second driving part 175 may shift the substrate stage 170 such that the substrate W moves along a first direction. The first direction may be in parallel with a horizontal direction. A direction in which the substrate W moves may be opposite to the first direction in which the PM moves. A moving speed of the substrate W may be adjusted such that the moving speed of the substrate W corresponds to a moving speed of the PM. For example, the substrate W may be exposed to the light in a scanning manner while the substrate W and the PM move in opposite directions with respect to each other at a constant speed.

As an alternative, the substrate W may be exposed to the light in a step manner. As another alternative, the substrate W may be exposed to light in the scanning manner and the step manner.

Hereinafter, a method of exposing a substrate to light will be described.

Figure 3:
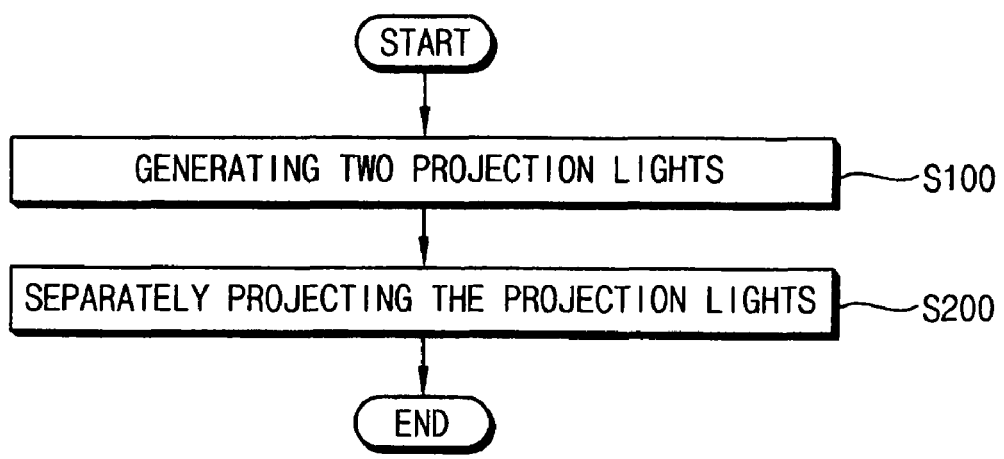
FIG. 3 is a block diagram illustrating a method of exposing a substrate to light in accordance with an example embodiment of the present invention.
Figure 4:
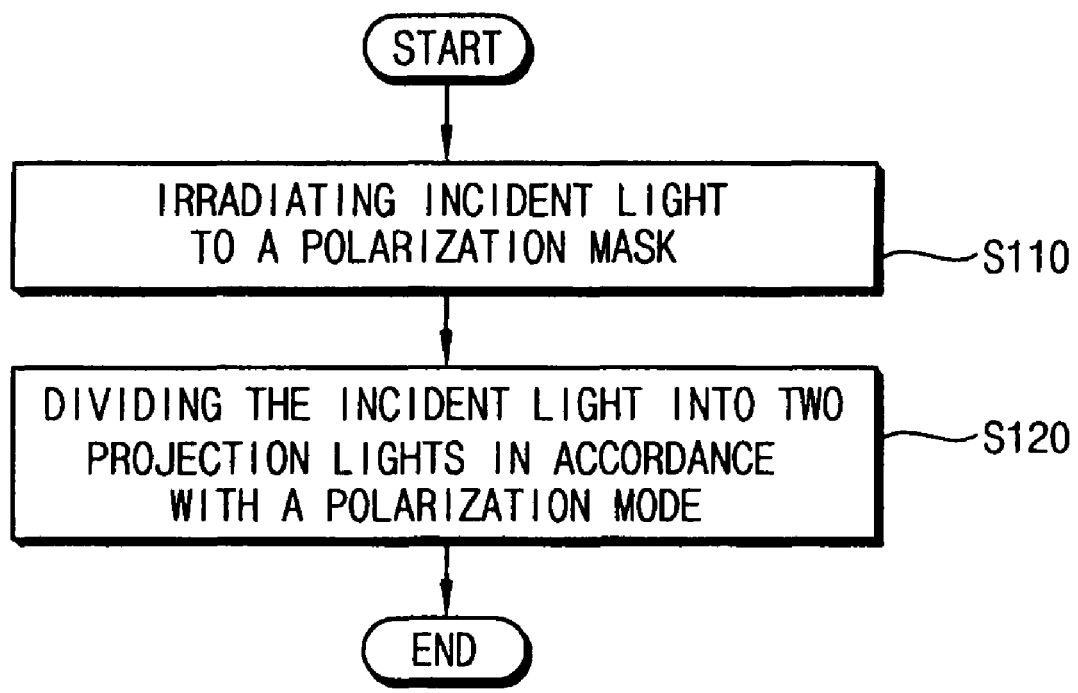
FIG. 4 is a block diagram illustrating a generation of a projection light in FIG. 3 in accordance with an example embodiment of the present invention.

FIG. 3 is a block diagram illustrating a method of exposing a substrate to light in accordance with an example embodiment of the present invention, and FIG. 4 is a block diagram illustrating a generation of a projection light in FIG. 3.

Referring to FIGS. 3 and 4, a PM may be loaded on the mask stage 120. The PM may include a first pattern transmitting a first light having a transverse magnetic mode and a second pattern transmitting a second light having a transverse electric mode.

The substrate W may be loaded on a substrate stage 170. A photoresist film (not shown) may be formed on a substrate W. A plurality of exposed portions may be provided on the substrate W. Each exposed portion may include at least one die region.

The distance between a projection slit part 160 and the substrate W may be measured by a sensor 166 located under a rear face or bottom side of the projection slit part 160. The distance between the projection slit part 160 and the substrate W and the inclination of the projection slit part 160 with respect to the substrate W may be adjusted by using the distance between the projection slit part 160 and the substrate W measured by the sensor 166.

A light source 110 may generate an incident light. The incident light may proceed through a lens 115 so that the incident light may be uniformly provided to a surface of the PM. When the incident light is provided to the surface of the PM, a first driving part 125 may move the mask stage 120 so that the PM may horizontally move along a first direction. Therefore, the incident light may be irradiated to the PM in step S110 (see FIG. 4).

The incident light transmitted through the PM may be separated into first and second projection lights by a beam splitter 130. For example, when the beam splitter 130 is in a transverse magnetic mode, the beam splitter 130 may transmit the incident light having the transverse magnetic mode and reflect the incident light having the transverse electric mode. When the beam splitter 130 is in a transverse electric mode, the beam splitter 130 may reflect the incident light having the transverse magnetic mode and transmit the incident light having the transverse electric mode. Thus, the first projection light transmitted through the beam splitter 130 and the second projection light reflected by the beam splitter 130 may be generated in step S100. The first and second projection lights may have different pattern information.

When a first shutter 140 is opened, the first projection light may be transmitted through the first shutter 140. On the other hand, when the first shutter 140 is closed, the first projection light may be blocked by the first shutter 140. When a second shutter 145 is opened, the second projection light may be transmitted through the second shutter 145. On the other hand, when the second shutter 145 is closed, the second projection light may be blocked by the second shutter 145. That is, the first and second shutters 140 and 145 may adjust points in time when the first and second projection lights are projected. For example, when the exposed portion of the substrate W is located on a proceeding path of the first projection light or the second projection light, the first shutter 140 or the second shutter 145 may be opened so that the first projection light or the second projection light may be projected to the exposed portion of the substrate W.

The first and second projection lights having different pattern information proceed through a mirror unit 150 so that the first and second projection lights may be changed into condensed first and second projection lights having reduced cross-sectional sizes. The condensed first and second projection lights having the reduced cross-sectional sizes may then be provided to the projection slit part 160.

The condensed first projection light and the condensed second projection light proceed through a first slit 162 and a second slit 164, respectively, of the projection slit part 160. The first slit 162 and the second slit 164 may have desired sizes. The first and second slits 162 and 164 may be spaced apart from each other by a desired distance. Accordingly, the first and second projection lights have desired cross-sectional sizes. In addition, the first and second projection lights spaced apart from each other by the distance between the first slit 162 and the second slit 164 may be separately projected to the substrate W in step S200.

The first and second projection lights may be subsequently projected to a desired exposed portion of the substrate W, because the first and second projection lights spaced apart from each other by the distance between the first slit 162 and the second slit 164 are separately projected to the substrate W.

The first and second projection lights may be projected to the substrate W without crossing and/or overlapping each other. When the first and second projection lights are provided to the surface of the substrate W, a second driving part 175 shifts a substrate stage 170 so that the substrate W may horizontally move along a first direction but in an opposite direction of the mask stage 120.

Accordingly, a first image of the first pattern and a second image of the second pattern may be projected on the substrate W by the first projection light and the second projection light, respectively.

Figure 5A:
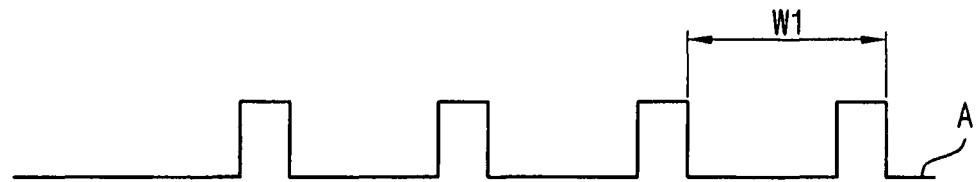
FIG. 5A a schematic view illustrating an image of a pattern projected on a substrate by a first projection light in accordance with an example embodiment of the present invention.
Figure 5B:
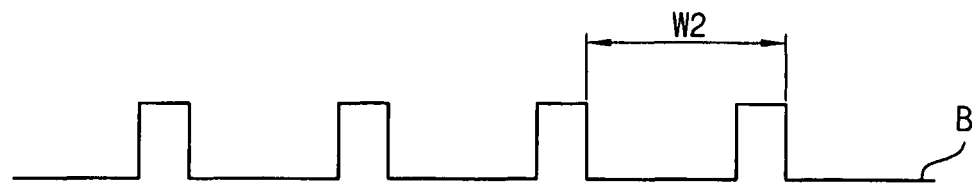
FIG. 5B is a schematic view illustrating an image of a pattern projected on a substrate by a second projection light in accordance with an example embodiment of the present invention.
Figure 5C:
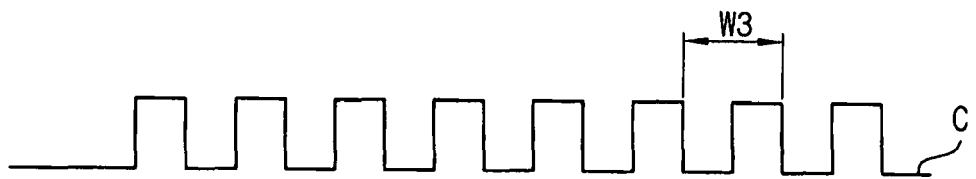
FIG. 5C is a schematic view illustrating an image of a pattern projected on a substrate by first and second projection lights in accordance with an example embodiment of the present invention.

FIG. 5A a schematic view illustrating an image of a pattern projected on a substrate by a first projection light in accordance with an example embodiment of the present invention. FIG. 5B is a schematic view illustrating an image of a pattern projected on a substrate by a second projection light in accordance with an example embodiment of the present invention. FIG. 5C is a schematic view illustrating an image of a pattern projected on a substrate by first and second projection lights in accordance with an example embodiment of the present invention.

Referring to FIGS. 5A to 5C, a first line A illustrated in FIG. 5A may show an image of a linear shaped pattern having a first line width W1. A second line B illustrated in FIG. 5B may show an image of a linear shaped pattern having a second line width W2. The first line A and the second line B may be obtained by separately providing the first and second projection lights having different pattern information to the substrate so that the first line A and the second line B may be mutually overlapped. Therefore, referring to FIG. 5C, a third line C showing an image of a linear shaped pattern having a third line width W3 may be projected on the substrate W. For example, the first line width W1 may be substantially the same as the second line width W2. The third line width W3 may be half of the first line width W1 or the second line width W2.

As described above, two different shapes of patterns may be projected on the substrate W by using a single PM. Therefore, time required for performing an exposure process may be shorter than when two masks are used for projecting two shapes of patterns to the substrate W. In addition, the patterns projected by using the two masks may be reduced or prevented from being misaligned.

Even though the apparatus 100 for exposing the substrate to the light has a resolution insufficient for projecting a pattern having the third line width W3, the apparatus 100 may project the pattern having the third line width W3 with a resolution capable of projecting a pattern having the first line width W1 or the second line width W2. In addition, the first and second projection lights may be projected along different proceeding paths so that an image of a pattern projected on the substrate may be improved.

According to example embodiments of the present invention, the light transmitting a polarization mask may be separated into two projection lights having different pattern information in accordance with a polarization mode. Two projection lights may then be projected to the substrate so that the substrate may be exposed. Two patterns may be projected to the substrate by using a polarization mask so that time required to perform an exposure process may be reduced. In addition, a misalignment of the two patterns may be prevented.

The foregoing is illustrative of example embodiments of the present invention and may not to be construed as limiting thereof. Although few embodiments of example embodiments of the present invention have been described, those skilled in the art will readily appreciate that many modifications are possible in the embodiments without materially departing from the teachings and aspects of example embodiments. Accordingly, all such modifications may be intended to be included within the scope of this invention as defined in the claims. Therefore, it is to be understood that the foregoing is illustrative of example embodiments and is not to be construed as limited to the specific embodiments disclosed.

What is claimed is:

1. An exposing method, comprising:
generating at least two projection lights, the at least two projection lights having different pattern information of one polarization mask; and
directing the at least two projection lights along different paths and onto a substrate,
wherein the generating the at least two projection lights includes:
irradiating one incident light to the polarization mask,
dividing the incident light transmitted through the polarization mask into the at least two projection lights in accordance with a polarization mode.

2. The method of claim 1, wherein the at least two lights are directed along different paths and do not cross each other.

3. The method of claim 1, wherein the polarization mode includes a transverse electric mode and a transverse magnetic mode.

4. The method of claim 3, wherein in the transverse electric mode, a transverse electric mode light is transmitted and a transverse magnetic mode light is reflected.

5. The method of claim 3, wherein in the transverse magnetic mode, a transverse magnetic mode light is transmitted and a transverse electric mode light is reflected.

6. The method of claim 1, wherein each of the at least two lights are selectively directed on a different region of the substrate.

7. An exposing apparatus, comprising:
a first optical unit configured to generate at least two projection lights and Including one polarization mask, the at least two projection lights having pattern information of the polarization mask; and
a second optical unit configured to direct the at least two projection lights along different paths and onto a substrate,
wherein the first optical unit includes:
a light source configured to irradiate light to be incident to the polarization mask, the polarization mask outputting at least the two projection lights, and
a beam splitter configured to divide the incident light transmitted through the polarization mask into the at least two projection lights in accordance with a polarization mode.

8. The apparatus of claim 7, wherein one of the at least two projection lights is a transverse electric mode light and the other of the at least two projection lights is a transverse magnetic light.

9. The apparatus of claim 8, wherein in the transverse electric mode, the transmitted electric mode light is transmitted and the transverse magnetic mode light is reflected through the beam splitter, respectively.

10. The apparatus of claim 8, wherein in the transverse magnetic mode, the transmitted magnetic mode light is transmitted and the transverse electric mode light is reflected through the beam splitter, respectively.

11. The apparatus of claim 7, wherein the first optical unit comprises:
at least one shutter configured to transmit or block one of the at least two lights.

12. The apparatus of claim 7, wherein the first optical unit comprises:
a mask stage configured to hold and to horizontally move the photomask.

13. The apparatus of claim 7, wherein the second optical unit comprises:
- a mirror unit configured to condense and reflect each of the at least two lights; and
- a projection slit part disposed between the mirror unit and the substrate, the projection slit part including at least one slit for projecting one of the condensed lights onto the substrate.

14. The apparatus of claim 13, wherein the mirror unit includes:
- a first condensing mirror and a first reflecting mirror configured to condense and reflect each of the at least two lights; and
- a second condensing mirror and a second reflecting mirror configured to condense and reflect each of the at least two lights.

15. The apparatus of claim 14, wherein:
the first and second condensing mirrors are concaved; and
the first and second reflecting mirrors are relatively flat.

16. The apparatus of claim 13, wherein the second optical unit further comprises:
- a sensor disposed on the projection slit part, the sensor configured to measure a distance between the substrate and the projection slit part.

* * * * *